(12) United States Patent
Brown et al.

(10) Patent No.: US 8,518,726 B2
(45) Date of Patent: Aug. 27, 2013

(54) USES OF A CARBON NANOBUD MOLECULE AND DEVICES COMPRISING THE SAME

(75) Inventors: David P. Brown, Helsinki (FI); Bradley J. Aitchison, Helsinki (FI)

(73) Assignee: Canatu Oy, Helsinki (FI)

( * ) Notice: Subject to any disclaimer, the term of this patent is extended or adjusted under 35 U.S.C. 154(b) by 319 days.

(21) Appl. No.: 13/001,476

(22) PCT Filed: Jun. 26, 2009

(86) PCT No.: PCT/FI2009/050578
§ 371 (c)(1),
(2), (4) Date: Feb. 16, 2011

(87) PCT Pub. No.: WO2009/156596
PCT Pub. Date: Dec. 30, 2009

(65) Prior Publication Data
US 2011/0127488 A1    Jun. 2, 2011

(30) Foreign Application Priority Data

Jun. 27, 2008 (FI) .................................... 20085667

(51) Int. Cl.
*H01L 51/54* (2006.01)
*H01L 51/56* (2006.01)
(52) U.S. Cl.
USPC ............................... 438/22; 438/99; 257/103
(58) Field of Classification Search
USPC ..................... 438/63, 82; 136/263; 257/428
See application file for complete search history.

(56) References Cited

U.S. PATENT DOCUMENTS

| | | |
|---|---|---|
| 2005/0098204 A1 | 5/2005 | Roscheisen et al. |
| 2005/0098205 A1 | 5/2005 | Roscheisen et al. |
| 2006/0198399 A1 | 9/2006 | Jablonski et al. |

FOREIGN PATENT DOCUMENTS

| | | |
|---|---|---|
| WO | WO 2007007061 A1 | 1/2007 |
| WO | WO 2007057501 A1 | 5/2007 |
| WO | WO 2009056686 A1 | 5/2009 |

OTHER PUBLICATIONS

International Search Report in connection with Appln. No. PCT/FI2009/050578, mailed Oct. 21, 2009.
Finnish Search Report in connection with 20085667, mailed May 25, 2009.
Guldi, D. M., et al., "Supramolecular Hybrids of [60] Fullerene and Single-Wall Carbon Nanotubes", Chem. Eur. J. 2006, 12, 3975-3983. ISSN: 0947-6539 (print), 1521-3765 (online). Published online Mar. 4, 2006, the whole document.
Kalita, G. et al., "Fullerene (C60) Decoration in Oxygen Plasma Treated Multiwalled Carbon Nanotubes for Photovoltaic Application", Applied Physics Letters 92, 063508 (2008). ISSN: 0003-6951. Published online Feb. 13, 2008, the whole document.
Wu, W. et al., "Synthesis and Characterization of a Grapevine Nanostructure Consisting of Single-Walled Carbon Nanotubes with Covalently Attached [60] Fullerene Balls", Chem. Eur. J. 2008, 14, 5981-5987. ISSN: 0947-6539 (print), 1521-3765 (oneline). Published online May 19, 2008, the whole document.

(Continued)

*Primary Examiner* — David Vu
*Assistant Examiner* — Earl Taylor
(74) *Attorney, Agent, or Firm* — Young & Thompson

(57) ABSTRACT

A carbon nanobud molecule (3, 9, 18, 23, 29, 36) having at least one fullerene part covalently bonded to the side of a tubular carbon molecule is used to interact with electromagnetic radiation in a device, wherein the interaction with electromagnetic radiation occurs through relaxation and/or excitation of the carbon nanobud molecule.

13 Claims, 9 Drawing Sheets

(56) References Cited

OTHER PUBLICATIONS

Figure 1:
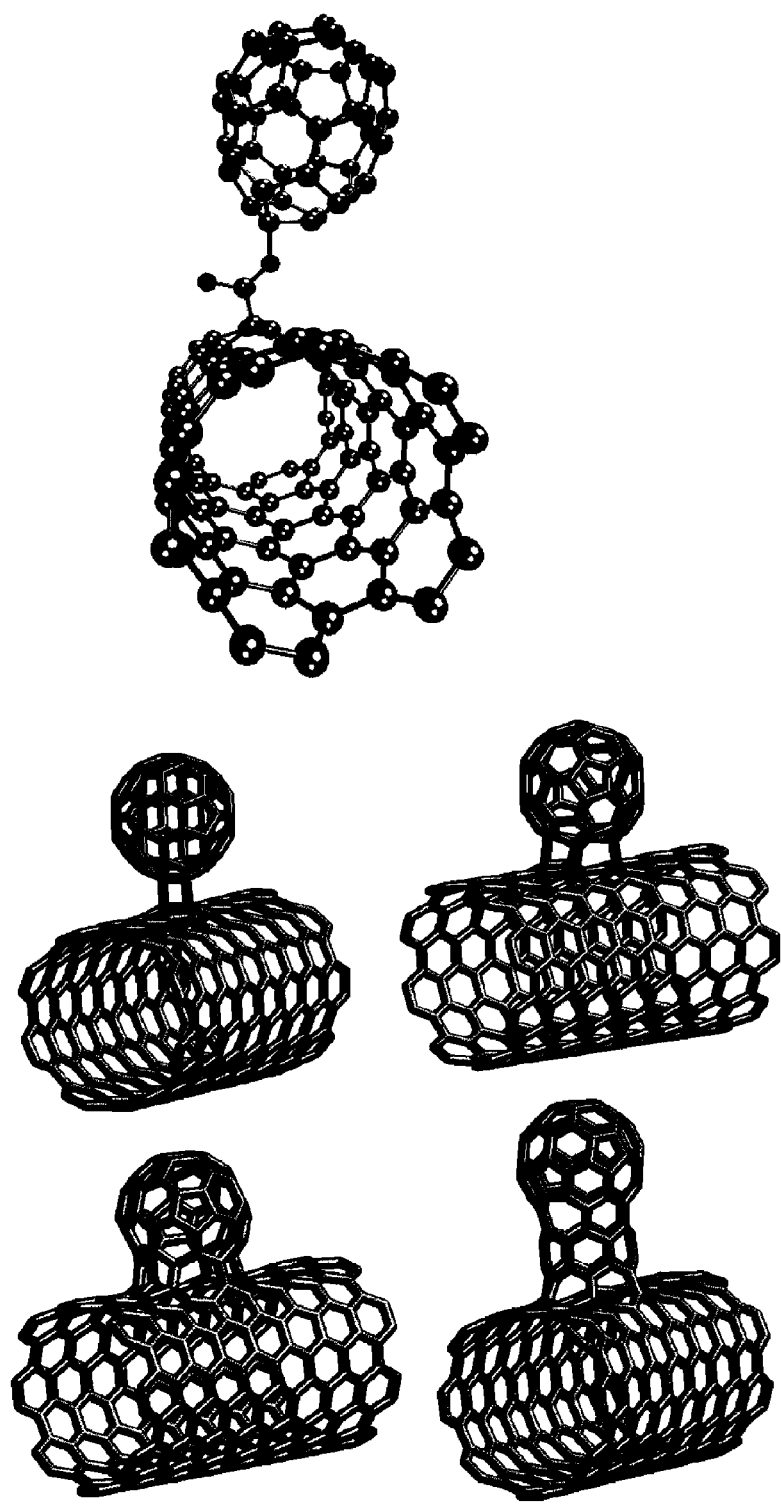

Umeyama, T. et al., "Clusterization, Electrophoretic Deposition, and Photoelectrochemical Properties of Fullerene-Functionalized Carbon Nanotube Composites", Chem. Eur. J. 2008, 14, 4875-4885. ISSN: 0947-6539 (print), 1521-3765 (online). Published online Apr. 16, 2008, the whole document.

Li, C. et al., "A Fullerene-Single Wall Carbon Nanotube Complex for Polymer Bulk Heterojunction Photovoltaic Cells", Journal of Materials Chemistry, 2007, 17, 2406-2411. ISSN: 0959-9428. Published online Mar. 12, 2007, the whole document.

Meng, Tiezhu et al., "First-Principles Study of a Hybrid Carbon Material: Imperfect Fullerenes Covalently Bonded to Defective Single-Walled Carbon Nanotubes", Physical Review B. 2008, vol. 77, 033415. ISSN: 1098-0121. Published Jan. 24, 2008, the whole document.

Wu, Xiaojun et al., "First-Principles Study of a Carbon Nanobud", ACS Nano. 2008, vol. 2, No. 7, 1459-65.

Fig. 1 (Prior-art)

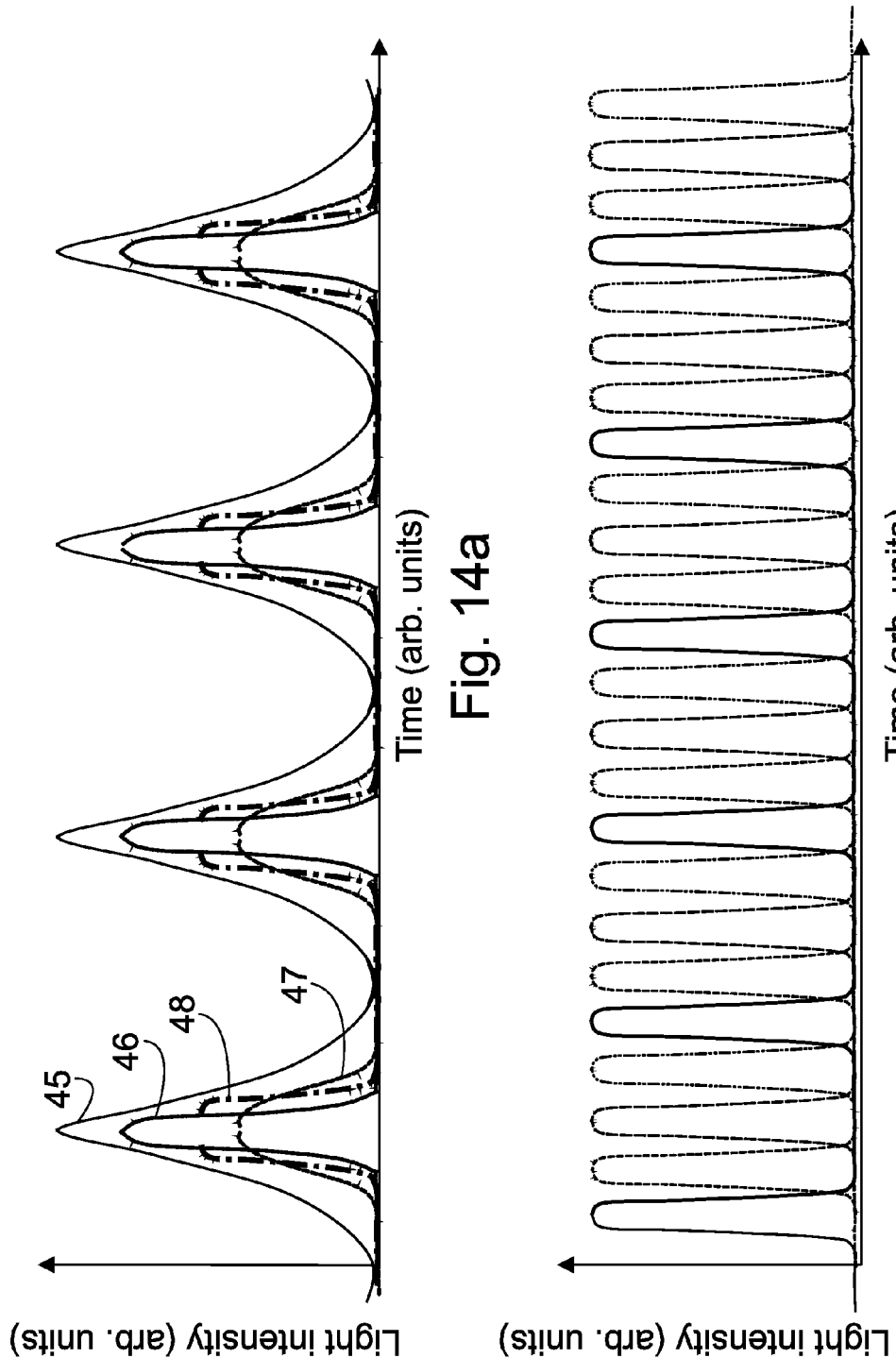

USES OF A CARBON NANOBUD MOLECULE AND DEVICES COMPRISING THE SAME

FIELD OF THE INVENTION

The present invention relates to nanotechnology. Especially the present invention relates to optical and optoelectronic devices based on using an optically active nanomaterial, and to methods for their production.

BACKGROUND OF THE INVENTION

Optical and optoelectronic devices find many applications in e.g. telecommunication networks and metrology. The devices in the aforementioned fields may comprise active devices such as lasers, amplifiers and detectors, and passive devices such as filters, polarizers and absorbers. In general, key parameters of these devices are power consumption (for active devices), stability which dictates the lifetime of the device and various parameters related to the function of the device; the functional parameters may include e.g. saturable absorption of electromagnetic radiation, polarization dependent absorption of electromagnetic radiation, internal and/or external quantum efficiencies etc.

Novel nanomaterials including e.g. nanotubes, nanowires, fullerenes, quantum dots, nanoparticles and nanowhiskers present a new way to tailor the key parameters in optical and optoelectronic devices. E.g. nonlinear optical effects may be introduced to and enhanced in a device by using these nanomaterials at a suitable location in the device structure. Although the new nanomaterials and nanostructures show promise in improving key parameters of optical and optoelectronic devices, the materials simultaneously present new challenges to the fabrication of these devices.

The method for the synthesis of nanostructures is strongly dependent on the structure itself. Some nanostructures e.g. quantum dots may be synthesized in a conventional thin-film deposition tool such as an MOCVD tool whereas fibrous network structures comprising e.g. nanowires may require a tool specifically designed for the synthesis and/or deposition of these high aspect ratio molecules (HARMs). The fabrication of devices comprising the new nanomaterials often requires manipulation of material at a molecular resolution. This is especially important in optical devices comprising HARMs where the specific orientation of a molecule with a high aspect ratio may significantly affect the optical properties of the device. An example of such a device is a polarizer (or polarizing filter) whose optical transmission coefficient depends on the polarization of incident light.

Additionally, of paramount importance in optical applications is the purity and homogeneity of the nanomaterial. In order to incorporate HARMs in a device the molecules are filtered from e.g. a gas stream and/or dispersed in a solution. These operations risk the incorporation of impurities in the optical device and the dispersion of HARMs in a solution is commonly insufficient to result in homogeneous material. Moreover, dispersion often requires the use of harsh treatments such as sonification and/or the use of surfactants and functionalizing materials, which may be detrimental to the operation of the device.

The performance of many of the currently known optical and optoelectronic devices based on nanostructures suffers from the difficulties in fabrication as well as from properties of the functional nanomaterial. For example publication WO2008/025966 A1 discloses a composition comprising nanomaterial in an optical coupling gel or an optical adhesive.

The invention disclosed in publication WO2008/025966 A1 suffers from inhomogeneous dispersion of the nanomaterial e.g. nanodots in the optical gel or adhesive. It may furthermore be difficult to obtain nanomaterial of sufficient purity for optical or optoelectronic devices from the nanomaterials disclosed in the publication.

For the improvement of existing, and for the development of new optical and optoelectronic devices it is important to find new nanomaterials with improved functionality, purity, versatility and homogeneity. Equally important is to develop new manufacturing methods that do not result in degradation and do not detrimentally alter the key properties of the materials utilized in these devices.

PURPOSE OF THE INVENTION

The purpose of the present invention is to reduce the aforementioned technical problems of the prior-art by providing new type of optical and optoelectronic devices based on using fullerene functionalized and covalently bonded fullerene functionalized tubular carbon molecules.

SUMMARY OF THE INVENTION

A use according to the present invention is characterized by what is presented in independent claim 1.

A device according to the present invention is characterized by what is presented in independent claim 10 or 12.

According to the present invention a carbon nanobud molecule having at least one fullerene part covalently bonded to the side of a tubular carbon molecule is used to interact with electromagnetic radiation in a device, wherein the interaction with electromagnetic radiation occurs through relaxation and/or excitation of the carbon nanobud molecule.

A device according to the present invention comprises a carbon nanobud molecule having at least one fullerene part covalently bonded to the side of a tubular carbon molecule. The device comprises one or more at least partly p-type electrically conductive carbon nanobud molecules and one or more at least partly n-type electrically conductive carbon nanobud molecules, such that the one or more at least partly p-type electrically conductive carbon nanobud molecules are in electrical contact with the one or more at least partly n-type electrically conductive carbon nanobud molecules to enable radiative electron-hole recombination.

A device according to the present invention comprises a carbon nanobud molecule having at least one fullerene part covalently bonded to the side of a tubular carbon molecule, and a chromophore is attached to the carbon nanobud molecule, to influence the spectral characteristics of the device and to enhance nonlinearity of absorption characteristics of electromagnetic radiation to the molecule.

In this context interaction of the carbon nanobud molecule with electromagnetic radiation should be understood as comprising all processes involving excitation or relaxation of the nanobud molecule which cause absorption or emission of electromagnetic radiation. Examples of devices where one or more carbon nanobud molecules may be used to perform functions related to emission, absorption and/or other interaction with electromagnetic radiation include e.g. emitters, displays, lasers, amplifiers, filters, polarizers, photodetectors, detector arrays (e.g. for cameras), bio-chemical sensors, markers for use in spectroscopic or fluorescence-related applications, signal regenerators, waveform shapers, dispersion compensators, wavelength converters, optically powered actuators (e.g. laser-driven nanomotor), optical switches, structurization-enhancing materials for lithographic processes, anti-reflective (AR) coatings or selectively reflectine coatings with superior chemical, mechanical or irradiation resistance, photographic or holographic materials for increased information storage density and phase or amplitude modulators. The one or more carbon nanobud molecules in these devices may take the form of e.g. a network, a deposit or a film or they may be incorporated in a matrix material, such as glass, quartz, crystalline material, polymer, optical gel or optical adhesive.

Components comprising carbon nanobud molecules which, according to the present invention, are used to interact with electromagnetic radiation are especially suitable for various optical or optoelectronic devices. A reason for this is that the synthesis processes for carbon nanobud molecules is able to produce purer, more crystalline and more homogeneous material than e.g. conventional synthesis processes for carbon nanotubes. This is a result of the specific geometry of the nanobud molecule enabling synthesis processes without the need for additional, potentially damaging, purification steps. The production methods result in material that meets the high purity, quality and homogeneity requirements for many optical applications. The carbon nanobud molecules furthermore combine the functional features of tubular carbon molecules and of fullerene molecules in a stable and robust structure which can be functionalized to modify the properties and behaviour of the material in which the nanobud molecules are incorporated. This may be especially useful in nonlinear optical applications performing functions such as saturable absorption, reverse saturable absorption, light amplification and polarization. Additionally, the fullerene part of the carbon nanobud molecule provides a means for separating the tubular part of the nanobud molecule from its neighbours, either by simple geometric considerations or by functionalization of the fullerene part, so as to avoid or otherwise control tube-tube interactions which can alter the optical characteristics of the material comprising carbon nanobud molecules. It is noted that the fullerene part of the carbon nanobud molecule can be a fullerene molecule or other fullerene-like structure possibly comprising a fullerene molecule.

Furthermore, the fullerene part or the fullerene-like structure bonded to the tubular part of the carbon nanobud molecule can be utilized to change the band-gap (the conductivity or semiconductivity) of the material comprising the carbon nanobud molecules. This allows absorption, emission or other electromagnetic interaction in the material to be tuned as a function of wavelength, temperature, chemical environment or other local conditions. The fullerene-like structure bonded to the tubular part of the carbon nanobud molecule can additionally be used as a bridging molecule between two nanobud molecules, either directly or via another bridging molecule such as an ester group. This may, for instance, be utilized to enhance relaxation of carriers within the nanobud molecules and/or to decrease the recovery time of the material comprising carbon nanobud molecules and/or to increase the mechanical robustness of a deposit or a film.

In one embodiment of the invention a chromophore is attached to the carbon nanobud molecule, to enhance non-linearity of absorption characteristics of electromagnetic radiation to the nanobud molecule.

In another embodiment of the invention the chromophore is attached to the fullerene part of the carbon nanobud molecule, to enhance non-linearity of absorption characteristics of electromagnetic radiation to the nanobud molecule.

By attaching a chromophore to a reactive site in the carbon nanobud molecule in the tubular part or in the fullerene part, a non-linear optical material may be realized. This type of material exhibits improved stability compared to non-linear optical materials of the prior art as a result of the stability of the carbon nanobud molecules. A chromophore in this context can be understood as any molecular structure generating a desired optical effect when interacting with electromagnetic radiation. Examples of chromophores inducing non-linear optical effects in carbon nanobud molecules include organic molecules such as polymers, oligomers, monomers and dimers. Specifically dye molecules e.g. phenosafranin (PSF) induce strong non-linear absorption characteristics to carbon nanobud molecules. A chromophore can also act as a bridging molecule referred to above. Carbon nanobud molecules can be deposited onto a device structure e.g. directly from the gas phase, without using dispersion of the nanobud molecules from a liquid solution, to improve the optical quality of the carbon nanobud molecules. Other production methods are also possible, such as spin coating or dispersing in a matrix material. The deposition of carbon nanobud molecules directly from the gas phase on a substrate such as an optical component structure, according to the method described in detail in WO2007/057501 A1, enables a more uniform distribution of the molecules compared to methods in which nanomaterial is dispersed in a matrix material. Deposition directly from the gas phase additionally decreases the risk of contamination by impurities and the risk of alteration of properties due to intermediate processing steps as long as the carbon nanobud molecules are efficiently separated from other molecules or particles in the gas. An additional benefit of depositing the carbon nanobud molecules directly from the gas-phase with the referenced method is that the optical properties of an individual carbon nanobud molecule, e.g. crystallinity and defect density, are improved. Furthermore, the nanobud molecules can be surfaced and debundled during the process, which promotes their dispersion in liquids or on solid substrates. In order to minimize the risk of contamination of the carbon nanobud molecules the substrate used for deposition of the carbon nanobud molecules can be different to the final substrate. A network comprising carbon nanobud molecules may be transferred from a preliminary substrate onto a final substrate, which may be part of e.g. an optical component, using the method described in patent application FI 20075482.

In one embodiment of the invention the device comprises two or more carbon nanobud molecules, wherein the two or more carbon nanobud molecules are separated from each other to increase the light capturing cross section of a single carbon nanobud molecule.

The average light capturing cross section of carbon nanobud molecules in a device may be increased by ensuring that the molecules are separated from each other in the device, as opposed to a situation where the carbon nanobud molecules reside close or even in contact with each other in the device. In the latter situation the carbon nanobud molecules may screen each other such that their average light capturing cross section is reduced. One way to enhance the separation of carbon nanobud molecules is to separate them from bundles of these molecules already at the deposition stage. This may be accomplished by e.g. exploiting the charge difference between bundled carbon nanobuds and individual carbon nanobud molecules. An increased light capturing cross section results in enhancement of the optical processes in the material comprising carbon nanobud molecules. Another way to enhance the separation is to bind individual nanobud molecules together by joining the fullerene or the fullerene-like parts of the nanobud molecule together by, for instance, bridging molecules so that the carbon nanobud molecules are less likely to bundle or rebundle during processing.

Yet another way to enhance the separation is to bind individual nanobud molecules to a matrix or surface material by joining the fullerene or the fullerene-like parts of the nanobud molecule to the matrix material via, for instance, appropriate matrix molecules, such as polymers, so that the carbon nanobud molecules are less likely to bundle.

In one embodiment of the invention the carbon nanobud molecule is used to saturably absorb electromagnetic radiation.

In another embodiment of the invention the carbon nanobud molecule is used to reverse saturably absorb electromagnetic radiation.

In another embodiment of the invention the tubular carbon molecule is used to saturably absorb electromagnetic radiation, and the fullerene part covalently bonded to the tubular carbon molecule is used to reverse saturably absorb electromagnetic radiation.

In yet another embodiment of the invention two or more mutually aligned carbon nanobud molecules are used to enable anisotropic absorption of electromagnetic radiation in the device.

Due to the asymmetrical shape of the carbon nanobud molecule these molecules may be easily electrostatically or otherwise polarized and aligned at will by positioning them e.g. in an electric or a magnetic field. The possibility to accurately align the absorbing molecules enables anisotropic absorption or modulation patterns for materials comprising carbon nanobud molecules. This feature together with the saturable and reverse saturable absorption characteristics of carbon nanobud molecules presents interesting opportunities for e.g. waveform shaping applications which can be used in pulse regeneration in optical telecommunication networks.

In one embodiment of the invention the carbon nanobud molecule is used for polarized optical emission.

In one embodiment of the invention the device comprises a first electrode in electrical contact with the one or more at least partly n-type electrically conductive carbon nanobud molecules, a second electrode in electrical contact with the one or more at least partly p-type electrically conductive carbon nanobud molecules, a gate electrode, and an insulating layer in between the gate electrode and the carbon nanobud molecules to electrically insulate the gate electrode from the carbon nanobud molecules.

The embodiments of the invention described hereinbefore may be used in any combination with each other. Several of the embodiments may be combined together to form a further embodiment of the invention. A use or a device, to which the invention is related, may comprise at least one of the embodiments of the invention described hereinbefore.

DETAILED DESCRIPTION OF THE INVENTION

Figure 3:
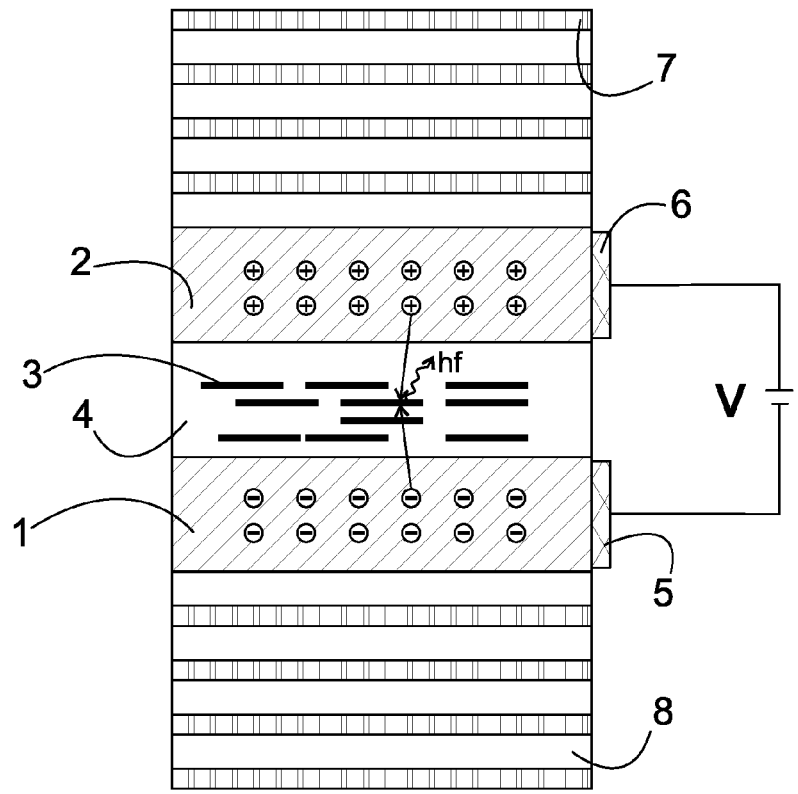
Figure 4:
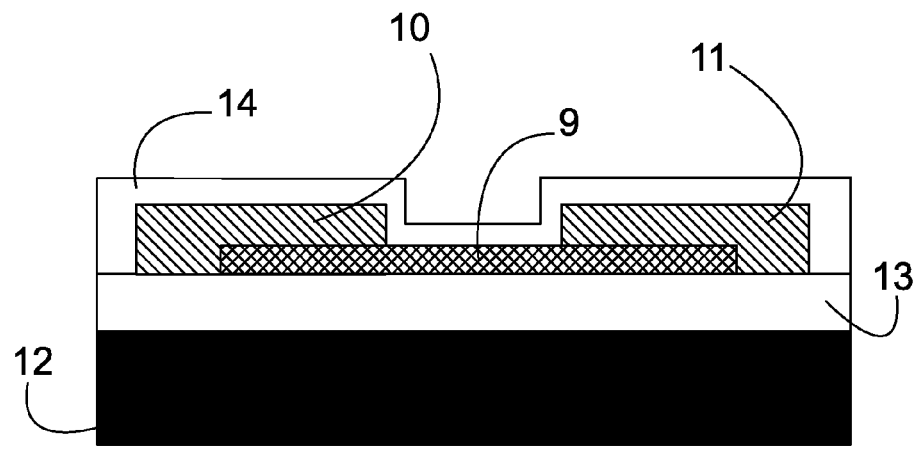
Figure 5:
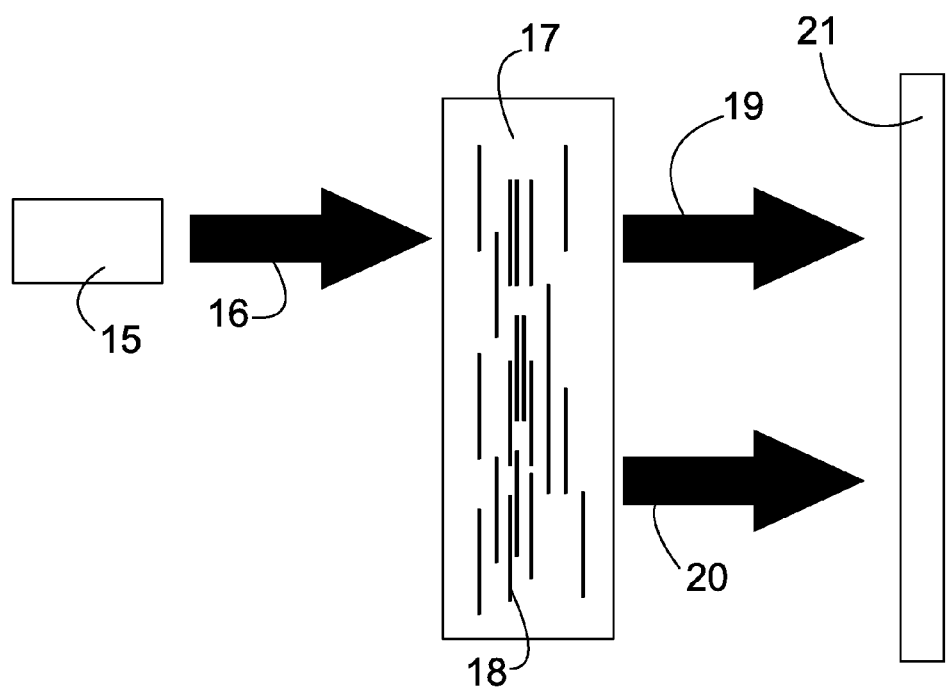
Figure 6:
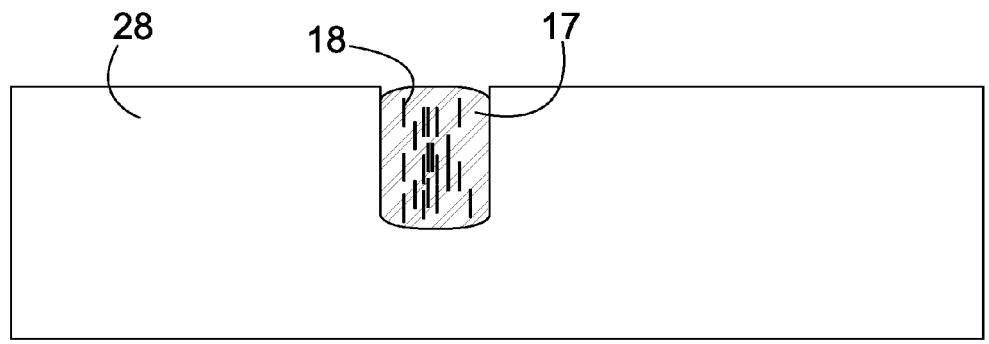
Figure 7A:
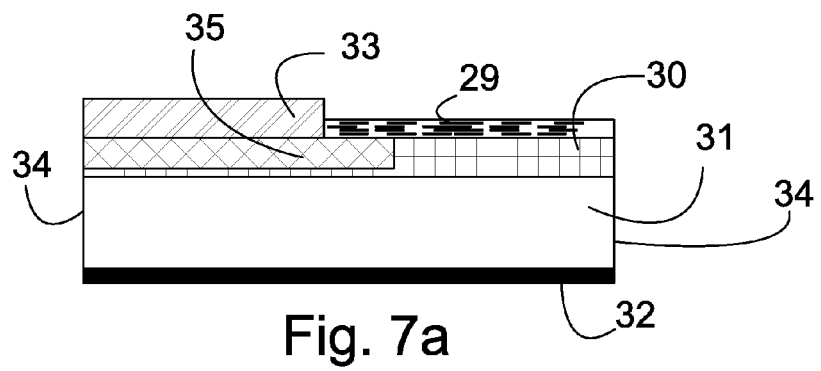
Figure 7B:
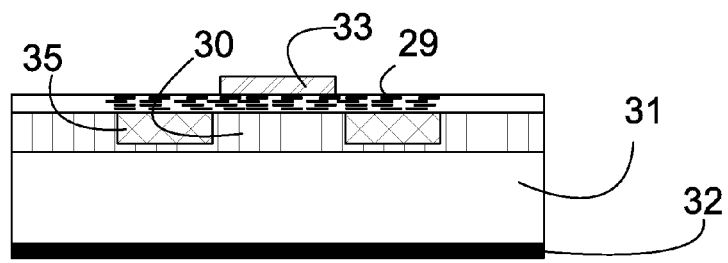
Figure 8:
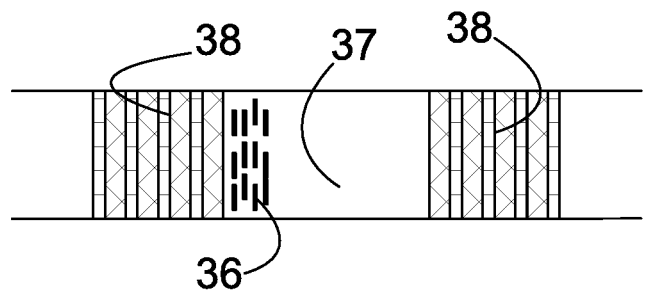
Figure 9:
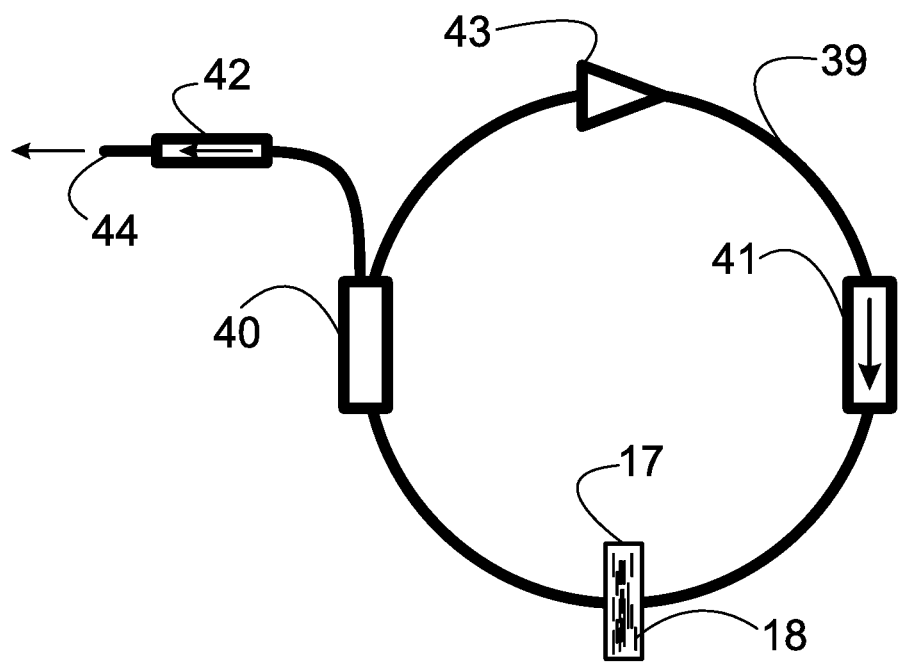
Figure 10:
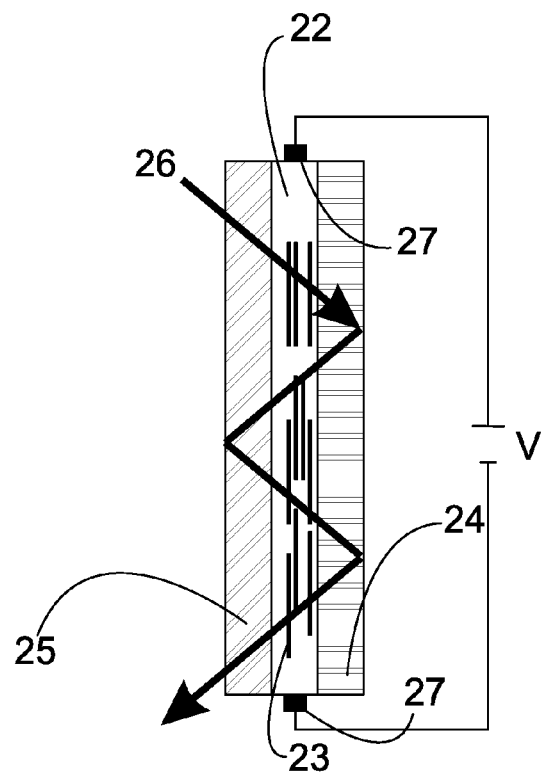
Figure 11:
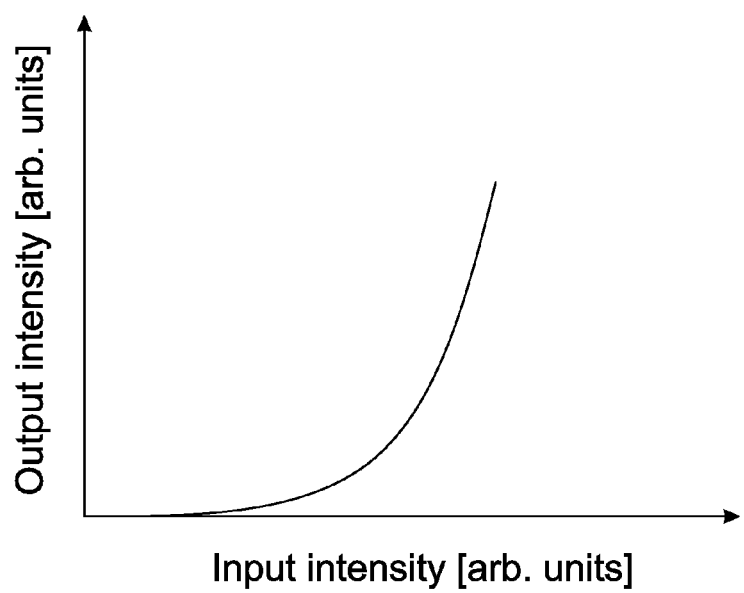
Figure 12:
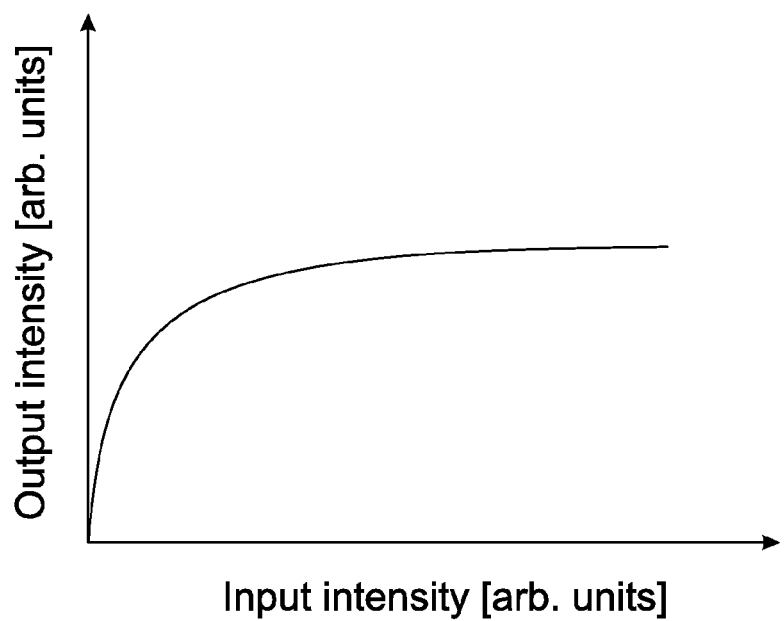
Figure 13:
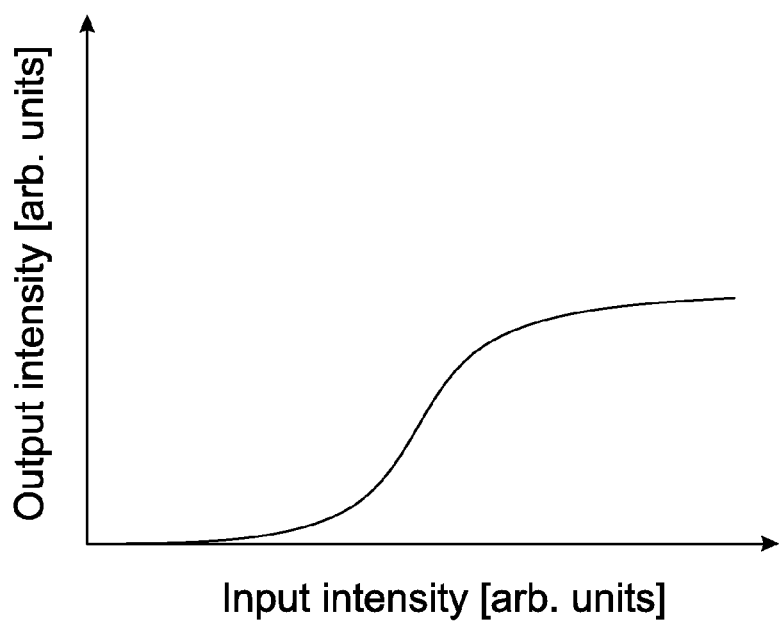
Figure 14C:
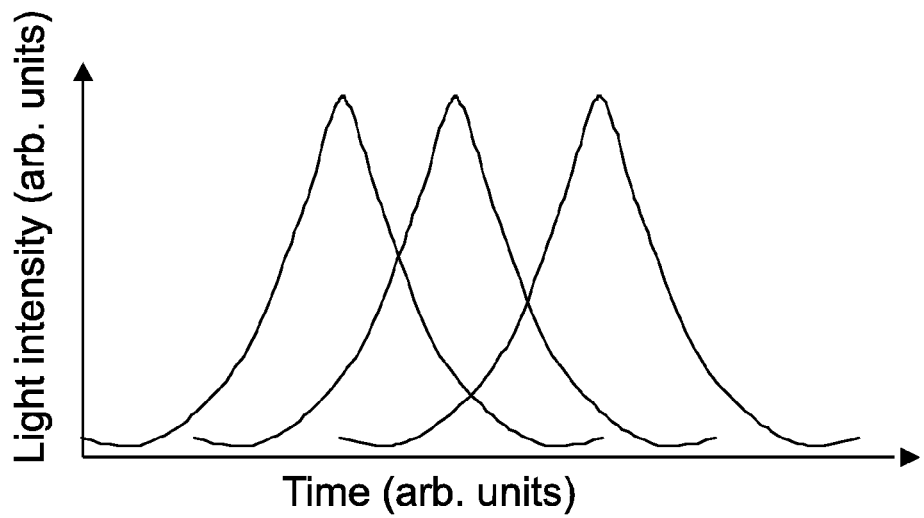
Figure 14D:
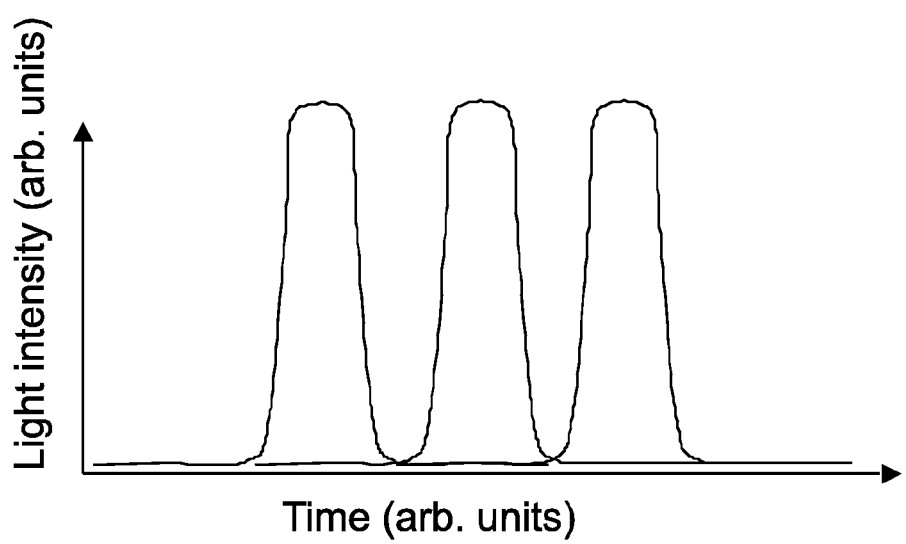

In the following, the present invention will be described in more detail. References will be made to the accompanying figures, in which FIG. 1 (Prior Art) presents five different molecular models for a carbon nanobud molecule in which at least one fullerene molecule or a fullerene-like molecular structure is covalently bonded to a tubular carbon molecule, FIG. 2 schematically presents a light emitting diode according to one embodiment of the present invention, FIG. 3 schematically presents a laser according to one embodiment of the present invention, FIG. 4 schematically presents a light emitting FET structure according to one embodiment of the present invention, FIG. 5 schematically presents a device setup according to one embodiment of the present invention, FIG. 6 schematically presents another device setup according to one embodiment of the present invention, FIG. 7a schematically presents a longitudinal cross section of a semiconductor laser according to one embodiment of the present invention, FIG. 7b schematically presents a transverse cross section of a semiconductor laser according to one embodiment of the present invention, FIG. 8 schematically presents a cross section of a fiber laser according to one embodiment of the present invention, FIG. 9 schematically presents a ring laser configuration according to one embodiment of the present invention, FIG. 10 schematically presents another device setup according to one embodiment of the present invention, FIG. 11 schematically presents a saturable absorption function, FIG. 12 schematically presents a reverse saturable absorption function, FIG. 13 schematically presents a combined saturable absorption and reverse saturable absorption function, FIG. 14a presents the effect of the saturable absorption, the reverse saturable absorption and the combined saturable and reverse saturable absorption functions on a stream of optical pulses, FIG. 14b presents how narrower pulses in an optical pulse stream enable an increased pulse rate, FIG. 14c presents an optical pulse sequence before reforming with a carbon nanobud-based saturable and reverse saturable absorber and FIG. 14d presents an optical pulse sequence after reforming with a carbon nanobud-based saturable and reverse saturable absorber.

Carbon nanobud molecules schematically illustrated in FIG. 1 can be synthesized from, for instance, a carbon source e.g. carbon monoxide using catalyst precursors such as ferrocene, or catalysts generated from a hot wire generator, such as metal particles and additional agents which, in addition to promoting the growth of nanobud molecules, increase the purity of the product. Details of the synthesis process can be found in publication WO2007/057501 A1, which is added as a reference herein.

Figure 2:
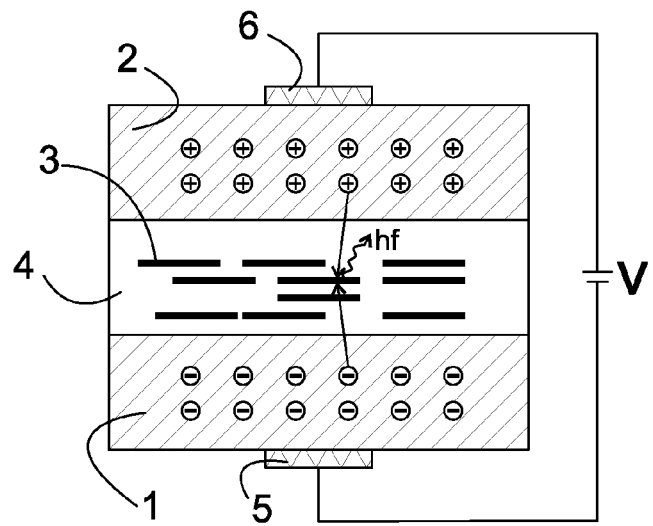

A light emitter structure based on light emission from carbon nanobud molecules is presented in FIG. 2. This structure comprises an n-type Si region 1 and a p-type Si region 2. In between these regions there is an insulating region comprising semiconducting carbon nanobud molecules 3 with a direct band gap embedded in an insulating matrix 4 material such as undoped Si or a thin (thickness 5-10 nm) layer of silicon oxide ($SiO_2$). Under operation a negative voltage $-V/2$ is applied to the electrical contact 5 on the n-type Si 1 side of the structure and a positive voltage V/2 is applied to the electrical contact 6 on the p-type Si 2 side of the structure. This injects electrons from the n-type Si 1 side and holes from the p-type Si 2 side towards the insulating region. When a hole and an electron encounter a carbon nanobud molecule 3 inside the insulating region they will undergo recombination which, with a finite probability, will be radiative.

The band gap of a carbon nanobud molecule can be tailored by adjusting the process used for the synthesis of these molecules. The band gap of carbon nanobud molecules may be e.g. modified by functionalization of the molecules with additional atoms or by adjusting the chirality. A carbon nanobud molecule 3 with a smaller band gap than the surrounding insulating matrix 4 may operate like a quantum dot confining charge carriers, tunnelled in the insulating region, to the carbon nanobud molecules 3 to enhance the internal quantum efficiency of the light emitter.

In one embodiment of the present invention the structure of FIG. 2 may be modified to function as a laser. The modified structure is presented in FIG. 3. It comprises Bragg-reflectors on both sides of the structure presented in FIG. 2. The Bragg-reflectors confine a Fabry-Perot microcavity where the active medium comprises carbon nanobud molecules as the light emitting material. The Bragg-reflectors may comprise e.g. alternating layers of Si 7 and $SiO_2$ 8 that form a highly reflective interference structure. When electron and holes are injected into the active medium at a sufficiently high rate to achieve population inversion in the active medium, lasing begins. The lasing wavelength in the structure of FIG. 3 is dictated by the interplay between the length of the Fabry-Perot cavity and the fundamental band gap of the light emitter, i.e. the carbon nanobud molecules 3. The thickness of the Si 7 and $SiO_2$ 8 layers in the Bragg-reflectors should be adjusted so that a sufficiently high reflectivity is achieved for the lasing wave-length. In order to achieve a high level of charge injection into the active medium highly doped n-type Si 1 and p-type Si 2 regions may be beneficial.

There may exist many variations to the light emitting structures of FIG. 2 and FIG. 3, which operate according to the corresponding principle. The n-type Si 1 and the p-type Si 2 regions may e.g. alternatively be formed by a network of p- and/or n-type carbon nanobud molecules that respectively form the p-and/or the n-type side of the structure. Additionally, in the laser structure of FIG. 3 the Bragg-reflectors may comprise carbon nanobud molecules within the reflector structure, or a Si 7 or a $SiO_2$ 8 layer may be replaced by a layer comprising carbon nanobud molecules.

The light emitting structures (the LED of FIG. 2 and the laser of FIG. 3) may be fabricated by depositing $SiO_2$ and Si by CVD or PECVD on a silicon substrate and by using a suitable annealing process for n- or p-type doping. Alternately, if nanobuds are used, suitably doped n- or p-type nanobud molecules can be deposited. The carbon nanobud molecules 3 are embedded into the active region of the light emitting device by overgrowing them with Si or a suitable thin layer of insulating material such as $SiO_2$.

A device according to one embodiment of the invention is a polarized light source. The device is schematically presented in FIG. 4. The device structure resembles a field effect transistor (FET) and it comprises a carbon nanobud molecule 9 in between a source 10 and a drain 11 electrode, a gate electrode 12, a gate dielectric 13 and a capping layer 14 on top of the drain 11 and the source 10 electrodes. By applying a voltage to the gate electrode 12, such that the potential of the gate is between the potential of the source and the drain, simultaneous electron and hole injection into the carbon nanobud molecule 9 is achieved. In this way a p-n junction is generated within a single carbon nanobud molecule 9. When an electron and a hole recombine in the carbon nanobud molecule 9 within the presented device, emission of polarized light has surprisingly been observed.

The operation of the device, the ambipolar FET, in FIG. 4 relies on the generation of thin Schottky barriers at each end of the carbon nanobud molecule 9 at the boundary of the source 10 and drain 11 contacts. When the device is suitably biased as described above, both electrons and holes are able to tunnel through the Schottky barriers into the carbon nanobud molecule 9 resulting in polarized light emission.

The device of FIG. 4 may be fabricated by e.g. depositing $SiO_2$ on a $p^+$-Si substrate wafer and dispersing carbon nanobud molecules on the insulating $SiO_2$ gate dielectric 13. The Ti drain 11 and source 10 electrodes may be e.g. deposited using PVD and then patterned by lithography to produce contact regions at suitable locations on the substrate. At this stage annealing in Ar atmosphere at e.g. 900° C. may be used to improve electrical contacting between the carbon nanobud molecule 9 and the Ti drain 11, and Ti source 10 contacts. The structure may be capped with a thin $SiO_2$ capping layer 14. The carbon nanobud molecule may be replaced by two or more carbon nanobud molecules in the device of FIG. 4 to form a further embodiment of the present invention.

In addition to the aforementioned devices which are based on electroluminescence of carbon nano-bud molecules, these molecules can additionally or exclusively be optically excited to perform various functions. Embodiments of the invention performing these functions will be described subsequently.

In one embodiment of the present invention one or more carbon nanobud molecules can be used in a device setup schematically and generically illustrated in FIG. 5. This setup comprises an input light source 15, an input beam 16 of electromagnetic radiation, a slab 17 of transparent or semi-transparent material 17 comprising one or more carbon nanobud molecules 18, two output beams of electromagnetic radiation (the transmitted beam 19 and the emitted beam 20) and a detection device 21. In this context transparency should be understood as transparency at the wavelengths of the beams of electromagnetic radiation presented in FIG. 5. The input light source 15 may be e.g. a laser or a broadband light source and it may be modulated. The detection device 21 may be e.g. a photodiode or other photosensitive device with the ability to detect radiation at the wavelengths of the two output beams 19, 20.

The transmitted beam 19 in FIG. 5 is the part of the input beam 16 that is transmitted through the slab 17 comprising carbon nanobud molecules 18 essentially without interaction with the slab 17. The emitted beam 20 is a beam of electromagnetic radiation emerging from the slab 17 as a result of the input beam 16 interacting with the carbon nanobud molecules 18 in the slab 17.

The carbon nanobud molecules 18 embedded in the slab 17 may absorb electromagnetic radiation at the wavelength, or at several wavelengths, of the input beam 16. This absorption may vary depending on many parameters such as direction, polarization, intensity and wavelength or wavelength spectral characteristics of the input beam 16. These dependencies enable the slab 17 to perform different functions which may be utilized in e.g. communication and measurement technology. It is noted that the slab 17 of FIG. 5 may take any geometrical shape.

When electromagnetic radiation is absorbed in the carbon nanobud molecule(s) 18 these molecules get excited as electrons move to higher energy states in the molecules. When relaxation of the same molecules occurs electrons move back to the lower energy states in the molecules and energy may be emitted at one or more wavelengths characteristic to the carbon nanobud molecules 18. It has surprisingly been observed, that carbon nanobud molecules 18 exhibit non-linear photoluminescence which can be used to e.g. perform logic operations, optical switching and modulation entirely in the optical domain.

As a result of the non-linear photoluminescence the intensity of the luminescent light emitted 20 from the slab 17 of FIG. 5 varies as a non-linear function of the intensity of the electromagnetic radiation, which is used to excite the carbon nanobud molecules 18 in the slab 17, i.e. the intensity of the input beam 16. Therefore, in the setup of FIG. 5 the output intensity of the emitted beam 20 can be dynamically controlled as a function of the intensity of the input beam 16. The signal processing and modulation may therefore be performed in a purely optical component as opposed to more conventional electro-optical modulator. This enables purely optical interconnection, signal processing and eventually logic operations with high switching speeds associated with optical signal processing.

An abrupt increase in light emission may be observed from the slab 17 when the intensity of the input beam 16 increases above a certain threshold value. The switching control parameter used is therefore the power $P_{in}$ of the relevant spectral components of the input beam 16. Control of this power may be realized by e.g. electro-optically modulating the input light source 15. The resulting intensity of the emitted beam 20 obeys the relation $P_o=\sigma P_{in}$.

The one or more carbon nanobud molecules 18 exhibiting the non-linear photoluminescence characteristics described above may be synthesized, for instance, by the aforementioned synthesis method disclosed in WO2007/057501 A1. To fabricate the slab 17 of FIG. 5 these one or more carbon nanobud molecules 18 are deposited on a transparent or semi-transparent substrate composed of e.g. quartz, borosilicate or soft glass. This transparent substrate may be inserted into, or positioned after, the reactor in which the carbon nanobud molecules 18 are synthesized in order to deposit the carbon nanobud molecules 18 onto the substrate directly from the gas phase. Alternatively the carbon nanobud molecules may first be deposited on a preliminary substrate and a network comprising carbon nanobud molecules may then be transferred from the preliminary substrate onto the final substrate, which may be e.g. the aforementioned transparent or semi-transparent substrate, using the method described in patent application FI 20075482.

The threshold value for the non-linear amplification depends on the process parameters used in the synthesis of the carbon nanobud molecules. The most critical parameters affecting the threshold value are the synthesis temperature which may be e.g. 900° C. and the concentration of additional reagents such as $H_2O$ and $CO_2$. The carbon atoms in the tubular part of the nanobud molecule should be linked to each other by sp*2 bonds to form hexagonal rings. The deposited carbon nanobud molecule or layer of carbon nanobud molecules 18 on a transparent substrate may be embedded inside a transparent structure (such as the slab 17) by e.g. coating the one or more carbon nanobud molecules 18 by a transparent or a semi-transparent film.

Another non-linear function called saturable absorption may be realized using the simple setup of FIG. 5. With this function e.g. the waveform of the transmitted beam 19 may be shaped or modulated, which may be useful e.g. in pulse regeneration in optical telecommunication networks or in laser components in the generation of short laser pulses. When the carbon nanobud molecules 18 in the slab 17 behave as saturable absorbers they absorb the electromagnetic radiation of the input beam 16 as a function of the intensity of the input beam 16. When the intensity of the input beam 16 is lower than the saturation threshold, absorption is high and a very small proportion of the intensity of the input beam 16 is transmitted through the slab 17. When the intensity exceeds the threshold the carbon nanobud molecules 18 are no longer able to absorb the radiation of the input beam 16 and the part of the intensity exceeding the saturation threshold (also called the bleaching threshold) gets transmitted through the slab 17. The saturable absorption function is illustrated in FIG. 11.

Saturable absorption may be realized by carbon nanobud molecules directly, or modified or enhanced by e.g. attaching chromophores to reactive sites on the tubular part, on the ends of the tubular part or on the fullerene (or fullerene-like) part of the carbon nanobud molecule. The activity of these chromophores in non-linear optics is based on their hyperpolarizability. Especially phenosafranin (PSF) is a molecule that can be used to create dipoles in the optically active material comprising carbon nanobud molecules. The generation of these dipoles strongly enhances the non-linear properties of the optically active material. As the carbon nanobud molecules are physically and chemically very stable molecules the non-linear optical material obtained by functionalizing carbon nanobuds with chromophores allows the use of strong optical fields without risk of degradation of the optical material.

An application utilizing a saturable absorber device based on the saturable absorption function of carbon nanobud molecules is a saturable absorber mirror. These mirrors comprise a reflective surface behind a slab (such as the slab 17) or a layer performing the saturable absorption function. Saturable absorber mirrors may be utilized in e.g. lasers as cavity mirrors for ultrashort pulse generation. A saturable absorber mirror based on carbon nanobud molecules may be fabricated by e.g. direct deposition from the gas phase, transfer deposition from a primary substrate or spin-coating the synthesized carbon nanobud molecules in a suitable transparent matrix material (e.g. polymer) on a reflecting surface.

Carbon nanobud molecules exhibit non-linear saturable absorption characteristics even on their own without chromophore attachments enhancing these non-linearities. The non-linearly absorbing carbon nanobud molecules with or without chromophore attachments may be incorporated in a gel or in an optical adhesive to form a nanocomposite material. The matrix material (i.e. the gel or the adhesive) in this composite may be chosen to possess certain application specific optical properties. E.g. the refractive index of the matrix material may be chosen to optically match two sections of an optical fiber. In this case the slab 17 of FIG. 5 corresponds to a piece of the nanocomposite which can take on any geometrical form. This piece may join together the medium in which the input beam 16 propagates and the medium in which the transmitted 19 and the emitted 20 beams propagate. The carbon nanobud molecules can alternatively simply be deposited on one or more surfaces in a cut or a break in the medium as presented schematically in FIG. 6. The cut may be partial (as shown in FIG. 6) or complete. In the figure a piece of nanocomposite 17 comprising carbon nanobud molecules 18 is deposited into a via in a solid medium 28. The solid medium may be, for instance, a gain medium in a laser or in an optical fiber.

The optical nanocomposite described above may be fabricated by e.g. taking up synthesized carbon nanobud molecules in a matrix material. The solution is then e.g. sonicated to generate a carbon nanobud suspension in the matrix material which may be e.g. liquid optical coupling gel or optical adhesive. The suspension is then mixed by e.g. ultracentrifugation. Alternatively, the nanocomposite can be produced by, for instance, the method of application FI 20075482 in which the nanobuds are first deposited on a primary substrate and then transferred and impregnated into a secondary substrate.

Saturably absorbing films based on carbon nanobud molecules can also be used for passive mode locking in e.g. pulsed fiber lasers, pulsed waveguide lasers or pulsed ring lasers. In these devices the carbon nanobud based saturable absorbers are used to passively modulate lasing modes inside the laser cavity to generate ultrashort laser pulses. The saturable absorber may be placed inside the optical cavity, to operate in transmission mode, or outside the optical cavity to operate by interaction with an evanescent wave of the lasing modes. In the latter case interaction with the evanescent wave can be accomplished by e.g. coating a tapered or a non-tapered fiber laser with a film comprising carbon nanobud molecules or depositing a layer comprising carbon nanobud molecules on a channel or on a planar waveguide of a semiconductor laser. The aforementioned pulsed laser devices take advantage of the fast recovery rate and excellent stability of the carbon nanobud molecules to generate ultrashort laser pulses e.g. in the femtosecond range with great reliability.

A schematic example of a passively mode locked laser diode structure utilizing a saturable absorber, based on an evanescent wave interacting with carbon nanobud molecules is presented by the longitudinal cross section of FIG. 7a and by the transverse cross section of FIG. 7b. The structure comprises carbon nanobud molecules 29 which are deposited on the planar waveguide outside of the active region 30 of a conventional semiconductor laser. The device further comprises an n-type substrate 31 (e.g. n-GaAs) on which semiconductor films, comprising the active region 30, are deposited. The active region 30 may be conventionally fabricated from e.g. doped III-V semi-conductors such as n- and p-type GaAs and AlGaAs in e.g. an MOCVD reactor and the active region 30 (the gain medium) of the device may comprise multiple quantum wells. The n-type 32 and the p-type 33 electrical contacts are also visible in FIG. 7a and FIG. 7b. The laser cavity is defined in the longitudinal direction by cleaved facets 34 of the laser chip, which serve the purpose of cavity mirrors. In the lateral direction carrier injection may be limited by suitably doping the active region 30 to fabricate insulating carrier guiding regions 35.

When the lasing modes are generated in the active region 30 of the device of FIG. 7a and FIG. 7b the modes propagate in the optical cavity defined by the cleaved facets 34 and a portion of the optical power distribution concentrated into the modes, the evanescent wave, overlaps with the carbon nanobud molecules 29. The saturable absorption of the carbon nanobud molecules 29 passively modulates the optical power of the laser modes resulting in mode locking of the laser.

FIG. 8 schematically presents how carbon nanobud molecules 36 may be placed inside the cavity 37 of a mode locked fiber laser to act as a saturable absorber in transmission mode. In FIG. 8 the carbon nanobud molecules 36 are placed at the end of the cavity 37, close to one of the fiber Bragg gratings 38 defining the length of the laser cavity 37. In this geometry the optical modes guided in the laser cavity 37 are modulated by saturable absorption as they pass through the region comprising carbon nanobud molecules 36. In one embodiment of the invention the carbon nanobud molecules may also be embedded as part of a cavity mirror in a laser to perform the saturable absorption function for mode locking.

FIG. 9 schematically presents how the carbon nanobud molecules may be utilized in a saturable absorber in a ring laser configuration, to achieve mode-locking. The configuration comprises the saturably absorbing element such as the slab 17 comprising carbon nanobud molecules 18 suitably connected to a ring of optical fiber 39 at the input and at the output side of the slab with e.g. optical couplers. The configuration further comprises a 50:50 coupler 40, a first optical isolator 41, a second optical isolator 42 and an erbium-doped fiber amplifier (EDFA) 43. The EDFA 43 is optically pumped with a pump laser (not shown).

In the mode-locked ring laser structure of FIG. 9 the EDFA 43 serves the purpose of gain medium, the first optical isolator 41 prevents back (counter clockwise) propagation of light in the ring 39 and the second optical isolator 42 prevents back propagation of light in the output path 44. The 50:50 coupler couples half of the intensity of light propagating in the ring 39 to the output path 44 and the other half back to the EDFA 43. The wavelength of the lasing modes supported by the ring laser of FIG. 9 is determined by the optical length of the propagation path for these modes around the ring 39. The supported wavelengths have to be such that constructive interference of light is achieved for each wave propagated around the fiber ring 39. This enables stimulated emission of light into the corresponding modes in the EDFA 43. When a slab 17 comprising saturably absorbing carbon nanobud molecules 18 is placed within the ring cavity as presented in FIG. 9, the saturable absorption function performed by the slab 17 modulates the lasing modes resulting in passive mode locking of the ring laser.

Carbon nanobud molecules with saturable absorption characteristics may be synthesized with the method disclosed in WO2007/057501 A1. To attach chromophores e.g. PSF to these molecules the carbon nanobud molecules can be first treated in acid, e.g. in $H_2SO_4/HNO_3$, to form carboxyl groups on the tubular and/or the fullerene part of the carbon nanobud molecule. PSF molecules can then be attached to these carboxyl groups by putting the carboxylated carbon nanobuds in deionized water containing PSF.

Another device setup according to one embodiment of the present invention is presented in FIG. 10. This setup comprises a layer 22 comprising nonlinearly absorbing carbon nanobud molecules 23 in between two mirrors, a back mirror 24 and a front mirror 25. The interferometric structure may be used to enhance the interaction of the input light 26 with the carbon nanobud molecules 23. The mirror behind the nanobud layer (as viewed from the side of the incident light 26), the back mirror 24, has a very high reflectivity so that incident light 26 is not able to escape the structure from the back side. As light impinges the structure it penetrates the less reflective front mirror 25 and goes through multiple reflections between the two mirrors 24, 25 before escaping the structure from the side of the front mirror 25. During each passage through the layer 22 comprising carbon nanobud molecules 23 a portion of the incident light interacts with the nanobud layer 22, which increases the total interaction volume. This type of interferometer furthermore exhibits spectral selectivity as the optical cavity in between the two mirrors 24, 25 only supports certain wavelengths depending on the length of the cavity. The device setup of FIG. 10 further comprises electrical contacts 27 such that a voltage V may be applied over the layer 22 comprising carbon nanobud molecules 23. This voltage V may be used to e.g. electrically modulate the optical properties of the layer 22.

In order for the slab 17 of FIG. 5 or the layer 22 of FIG. 10 to efficiently act as a non-linear optical component the light absorbing volume of the slab 17 or the layer 22 should be maximized. To this end the average light capturing cross section of the carbon nanobud molecules per one carbon nanobud molecule should be maximized. The average light capturing cross section may be increased by ensuring that the molecules are separated from each other in the slab 17 or the layer 22. One way to enhance the separation of carbon nanobud molecules is to separate them from bundles of these molecules already at the deposition stage. This may be accomplished by e.g. exploiting the electric charge difference between bundled carbon nanobuds and individual carbon nanobud molecules. An increased light capturing cross section results in enhancement of the optical processes in the material comprising carbon nanobud molecules.

In one embodiment of the invention the device utilizes a reverse saturable absorption function of the carbon nanobud molecule. In the case of e.g. FIG. 5, reverse saturable absorption means that absorption of the input beam 16 increases as a function of the intensity of the input beam 16. Hence the carbon nanobud molecules 18 or a piece of material comprising carbon nanobud molecules, such as the slab 17 in FIG. 5, may be utilized as an optical limiter in protective devices.

These devices may find applications in e.g. optical sensors and eye protection equipment. The reverse saturable absorption function is illustrated in FIG. 12. It has surprisingly been observed that the fullerene part of the carbon nanobud molecule efficiently acts as a reverse saturable absorber. It has especially been observed that a fullerene-like structure or a fullerene, e.g. the buckminsterfullerene $C_{60}$, is an efficient reverse saturable absorber in the carbon nanobud molecule. Additionally, as the tubular part of the carbon nanobud molecule by itself or via functionalization by chromophores exhibits saturable absorption characteristics as described above, the carbon nanobud molecules provide an exceptional platform for anisotropically functioning optical or optoelectronic devices.

Additionally, the reverse saturable absorption function of the fullerene parts of the nanobud molecule can be used, in combination with the saturable absorption function, to limit the intensity of the electromagnetic radiation transmitted through a region comprising the carbon nanobud molecules in any of the aforementioned embodiments of the invention. By controlling the concentration of fullerene parts in the nanobuds, the reverse saturable absorption effect can be controlled. This function can be used to, for instance, limit the output intensity of a device or protect portions of a device from damage due to excess electromagnetic energy.

Since the carbon nanobud molecules exhibit both saturable absorption (the tubular part of the nanobud molecule) and reverse saturable absorption (the fullerene part of the nanobud molecule) characteristics, these molecules may be easily used to generate an input-output relation according to FIG. 13 combining the saturable absorption and the reverse saturable absorption functions. This relation may be observed e.g. in the device setup of FIG. 5 between the input beam 16 and the transmitted beam 19. This type of a versatile input-output function can be efficiently used in e.g. optical signal processing, pulse regeneration, waveform shaping and optical switching applications.

As shown in FIG. 14a, the reverse saturable absorption function combined with the saturable absorption function allows an electromagnetic pulse to be shaped. FIG. 14a illustrates how the original pulse sequence 45 is modified by the saturable absorption function alone 46, by the reverse saturable absorption function alone 47, and by combined saturable and reverse saturable absorption functions 48 according to one embodiment of the invention to produce, for instance, a more square-shaped pulse having shorter rise and fall times from the wide, poorly formed original pulse sequence 45 having longer rise and fall times.

Such a modified pulse is narrower and easier to isolate by a detection device, thus allowing an increase in the pulse rate and bandwidth of an optical information stream, for instance, in an optical fiber. Improved pulse separation is shown in FIG. 14c and FIG. 14d for a pulse before (FIG. 14c) and after (FIG. 14d) reforming with the described method. The ability to increase the pulse rate as a result of narrower pulses becomes evident from FIG. 14b illustrating four different pulse sequences with differently dashed lines.

In these pulse sequences the separate pulses can be readily isolated.

Adjustment, for instance, of the concentration of fullerene parts in the carbon nanobud molecules, of the concentration of nanobud molecules in a matrix material, of the diameter of the nanobud molecules and of the type and amount of functionalization of the nanobud molecules, e.g. with chromophores, can be used to determine the modulation function the carbon nanobuds superimpose on electromagnetic radiation and thus to determine the resulting pulse shape and intensity.

By using the polarization resulting from the asymmetrical shape of the carbon nanobud molecule, the carbon nanobud molecules may be aligned in a specified direction by exposing them to an external electric field. As this alignment dictates the relative orientation of the reverse saturably absorbing fullerene part and the saturably absorbing tubular part of the carbon nanobud molecule, it is possible to design devices in which an input beam (e.g. the input beam 16 of FIG. 5) of electromagnetic radiation experiences saturable or reverse saturable absorption depending on the angle of incidence of the input beam with the carbon nanobud molecules.

As is clear for a person skilled in the art, the invention is not limited to the examples described above but the embodiments can freely vary within the scope of the claims.

The invention claimed is:

1. A method of using a carbon nanobud molecule to interact with electromagnetic radiation in a device, comprising:
depositing a carbon nanobud molecule (3, 9, 18, 23, 29, 36) having at least one fullerene part covalently bonded to the side of a tubular carbon molecule onto a device to interact with electromagnetic radiation in the device, wherein the interaction with electromagnetic radiation occurs through relaxation and/or excitation of the carbon nanobud molecule.

2. The method of claim 1, characterized in that the carbon nanobud molecule saturably absorbs the electromagnetic radiation.

3. The method of claim 1, characterized in that the carbon nanobud molecule reverse saturably absorbs the electromagnetic radiation.

4. The method of claim 1, characterized in that the tubular carbon molecule saturably absorbs the electromagnetic radiation, and the fullerene part covalently bonded to the tubular carbon molecule reverse saturably absorbs the electromagnetic radiation.

5. The method of claim 1, characterized in that two or more mutually aligned carbon nanobud molecules are deposited, and the molecules enable anisotropic absorption of electromagnetic radiation in the device.

6. The method of claim 1, characterized in that the carbon nanobud molecule interacts with polarized optical emission.

7. The method of claim 1, characterized in that a chromophore is attached to the carbon nanobud molecule, to enhance non-linearity of absorption characteristics of electromagnetic radiation to the nanobud molecule.

8. The method of claim 7, characterized in that the chromophore is attached to the fullerene part of the carbon nanobud molecule, to enhance non-linearity of absorption characteristics of electromagnetic radiation to the nanobud molecule.

9. The method of claim 1, characterized in that two or more carbon nanobud molecules are deposited onto the device, wherein the two or more carbon nanobud molecules are separated from each other to increase the light capturing cross section of a single carbon nanobud molecule.

10. A device comprising a carbon nanobud molecule (3, 9, 18, 23, 29, 36) having at least one fullerene part covalently bonded to the side of a tubular carbon molecule, characterized in that the device comprises one or more at least partly p-type electrically conductive carbon nanobud molecules and one or more at least partly n-type electrically conductive carbon nanobud molecules, such that the one or more at least partly p-type electrically conductive carbon nanobud molecules are in electrical contact with the one or more at least partly n-type electrically conductive carbon nanobud molecules to enable radiative electron-hole recombination.

11. The device of claim 10 characterized in that the device comprises a first electrode (10) in electrical contact with the one or more at least partly n-type electrically conductive carbon nanobud molecules (9), a second electrode (11) in electrical contact with the one or more at least partly p-type electrically conductive carbon nanobud molecules (9), a gate electrode (12), and an insulating layer (13) in between the gate electrode (12) and the carbon nanobud molecules (9) to electrically insulate the gate electrode (12) from the carbon nanobud molecules(9).

12. A device comprising a carbon nanobud molecule (3, 9, 18, 23, 29, 36) having at least one fullerene part covalently bonded to the side of a tubular carbon molecule, characterized in that, a chromophore is attached to the carbon nanobud molecule, to influence the spectral characteristics of the device and to enhance non-linearity of absorption characteristics of electromagnetic radiation to the molecule.

13. The device of claim 12, characterized in that the chromophore is attached to the fullerene part of the carbon nanobud molecule, to influence the spectral characteristics of the device and to enhance non-linearity of absorption characteristics of electromagnetic radiation to the molecule.

* * * * *

UNITED STATES PATENT AND TRADEMARK OFFICE
CERTIFICATE OF CORRECTION

PATENT NO. : 8,518,726 B2  Page 1 of 1
APPLICATION NO. : 13/001476
DATED : August 27, 2013
INVENTOR(S) : Brown et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 368 days.

Signed and Sealed this
Fifteenth Day of September, 2015

Michelle K. Lee
*Director of the United States Patent and Trademark Office*